United States Patent [19]

Allport et al.

[11] 4,169,282
[45] Sep. 25, 1979

[54] MULTIPHASE FULL-WAVE RECTIFIER ASSEMBLY

[75] Inventors: Maurice J. Allport, Birmingham; Alan R. Moore, Aldridge; Robert Hemmings, Halesowen, all of England

[73] Assignee: Lucas Industries Limited, Birmingham, England

[21] Appl. No.: 843,732

[22] Filed: Oct. 19, 1977

[30] Foreign Application Priority Data

Oct. 22, 1976 [GB] United Kingdom ............... 44041/76

[51] Int. Cl.² ...................... H02M 1/00; H02K 11/00
[52] U.S. Cl. .................................. 363/145; 310/68 D
[58] Field of Search ............. 363/145, 144; 310/68 R, 310/68 D

[56] References Cited

U.S. PATENT DOCUMENTS

| 3,527,972 | 9/1970 | Franz et al. | 310/68 D |
| 3,629,631 | 12/1971 | Cotton et al. | 363/145 |
| 3,924,147 | 12/1975 | Tarnow et al. | 310/68 D |

Primary Examiner—J D Miller
Assistant Examiner—Peter S. Wong
Attorney, Agent, or Firm—Trexler, Wolters, Bushnell & Fosse, Ltd.

[57] ABSTRACT

A multiphase, full-wave rectifier assembly for an alternator has first and second mutually parallel plates carrying first and second sets of diodes. Connectors electrically connect terminals of respective diodes of the first and second sets with each other and with terminals of respective field diodes heads of a multiphase stator of the alternator are connected respectively with the connectors. Each field diode is held in a respective recess defined between first and second plates of a common electrical connector for the field diodes. Each recess is defined by a U-shaped portion in the first plate of the common electrical connector and a part of the second plate of the common electrical connector, said part closing the U-shaped portion. Deformable tags on the ends of the U-shaped portions pass through corresponding slots in the second plate of the common electrical connector and are deformed so as to hold said plates together.

12 Claims, 6 Drawing Figures

MULTIPHASE FULL-WAVE RECTIFIER ASSEMBLY

This invention relates to a multiphase, full-wave rectifier assembly particularly, but not exclusively, for an alternator. The present invention also relates to an alternator including such a rectifier assembly.

According to one aspect of the present invention, there is provided a multiphase full-wave rectifier assembly, comprising a first plate, a second plate substantially parallel to the first plate, first and second sets of diodes carried by the first and second plates respectively, terminals of the first set of diodes extending through holes in the second plate, a connector electrically connecting said terminal of each diode of the first set with a terminal of a respective diode of the second set, a further set of diodes, one of the terminals of each diode of the further set being electrically connected with a respective one of the connectors, and a common electrical connector connecting together the other terminals of the diodes of the further set, wherein the common electrical connector is heat conducting and has recesses therein which receive the bodies of the diodes of the further set.

Preferably, the recesses are arranged to grip the bodies of the diodes so that manufacture of the rectifier assembly, the diodes is facilitated.

In a convenient embodiment, the common electrical connector comprises first and second plates which are secured together in electrical contact, and the recesses are defined between the plates.

In an alternative embodiment, the common electrical connector comprises a single part in which the recesses are provided and which may include portions for retaining the diodes in the recesses.

The first plate of the common electrical connector may include a series of substantially U-shaped portions which are closed by portions of the second plate of the common electrical connector whereby the recesses are in the form of open ended passages extending through the common electrical connector.

Preferably, the ends of arms of the U-shaped portions are provided with deformable tags extending therefrom, said tags projecting through corresponding slots in the second plate of the common electrical connector and being turned over so as to hold the plates of the common electrical connector together.

Most advantageously, the U-shaped portions of the first plate of the common electrical connector are interconnected by a plate portion which is apertured to receive said other terminals of the diodes of the further set.

Preferably also, the first plate of the common electrical connector is provided with apertured legs engaging against correspondingly apertured portions of the second plate of the common electrical connector, and fixing screws pass through said apertures to secure the common electrical connector to the remainder of the rectifier assembly.

According to another aspect of the present invention, there is provided an alternator comprising a multiphase stator, a rotor, a rectifier assembly as defined in any one of the last preceding eight paragraphs, and each phase of said stator being electrically connected with a respective one of said connectors which electrically interconnect said terminal of each diode of the first set with the respective diode of the second set.

Most advantageously, each said electrical connector which interconnects the terminals of each diode of the first set with the respective diode of the second set has a re-entrant recess therein whereby an electrical lead of a respective face can be snap-fitted into said recess.

An embodiment of the present invention will now be described, by way of example, with reference to the accompanying drawings in which.

Figure 1:
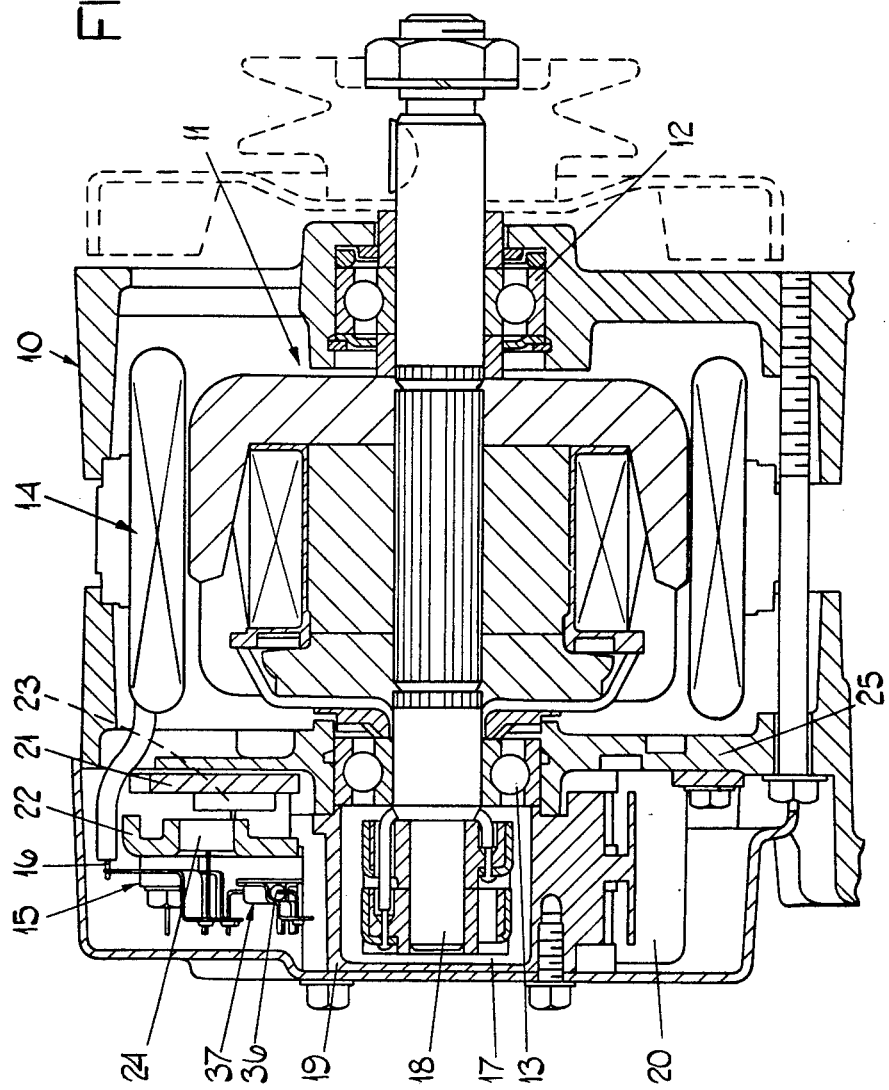
FIG. 1 is a longitudinal section through an alternator which includes a multiphase, full-wave rectifier assembly according to the present invention.

Referring now to FIG. 1 of the drawings, the alternator illustrated therein comprises a composite housing 10, a rotor assembly 11 rotatably mounted in front and rear bearings 12 and 13 respectively in the housing, and a stator assembly 14 surrounding the rotor assembly 11. The alternator further includes a rectifier assembly 15 to which leads 16 from the stator assembly 14 are connected in a manner to be described hereinafter, a slip ring assembly 17 mounted on a shaft 18 of the rotor assembly 11, a synthetic plastics housing 19 for bushes (not shown) which engage the slip ring assembly, and a voltage regulator 20 (only partly shown).

The rectifier assembly 15 comprises first and second electrically conducting plates 21 and 22 having plunged holes therein in which are located respective first and second sets of three diodes 23 and 24. The first and second plates 21 and 22 are spaced apart in parallel relationship and the first plate 21 is disposed closely adjacent an end bracket 25 of the alternator housing 10. The first and second plates 21 and 22 are both of generally arcuate form and are so mutually arranged that terminals 26 of the first diodes 23 extend through holes 27 in the second plate 22, the hole 27 being sufficiently large that there is no risk of the terminals 26 becoming electrically connected directly with the second plate 22. The diodes 24 of the second set also have terminals 28 which project away from that side of the second plate 22 remote from the first plate 21. Each terminal 26 is electrically connected with a respective terminal 28 by way of a respective, configured sheet metal connector 29. The connectors 29 are mounted on the second plate 22 by means of screws 30 and electrically insulating bushes 31 whereby the connectors 29 are electrically isolated from the second plate 22. The screws 30 also assist in maintaining the first and second plates 21 and 22 in the desired spaced relationship. The screws 30 pass through electrically insulating bushes 34 disposed between the plates 21 and 22 so that the latter are electrically isolated from each other.

Figure 2:
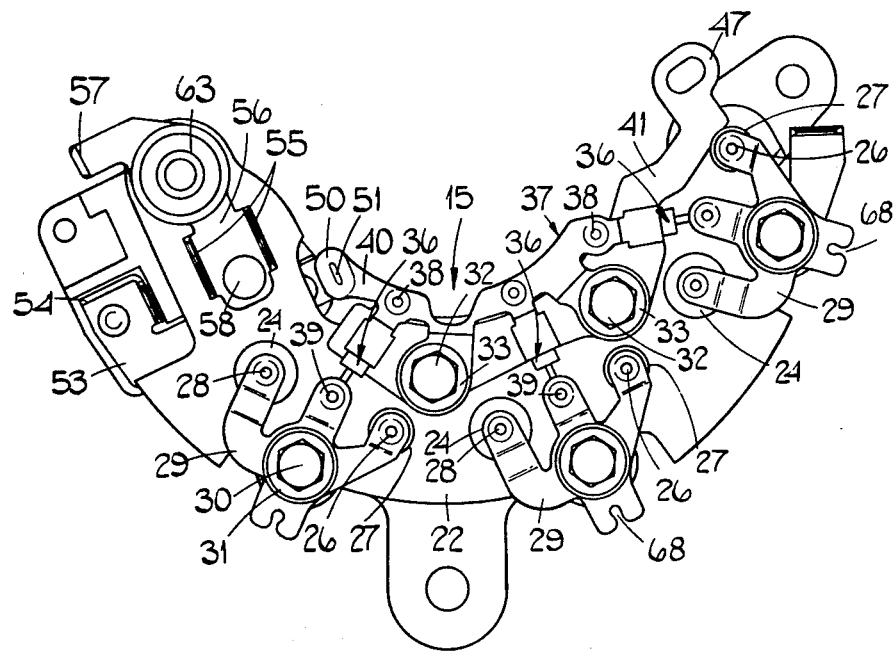
FIG. 2 is a plan view of the rectifier assembly of FIG. 1.
Figure 3:
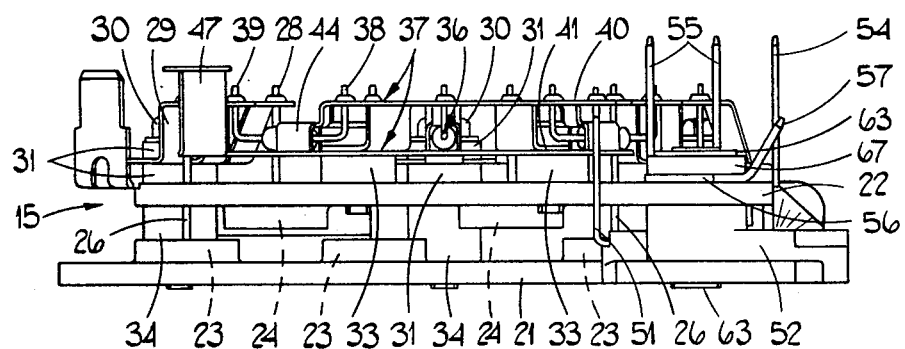
FIG. 3 is a side elevation of the rectifier assembly of FIG. 2.
Figure 4:
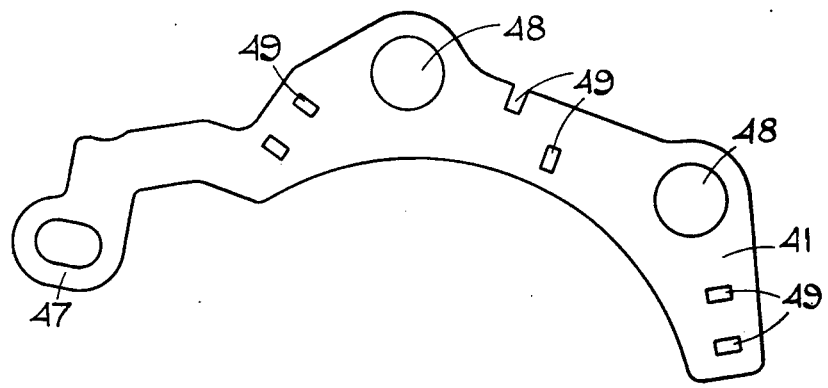
FIG. 4 is a plan view, on a larger scale, of part of a common electrical connector forming part of the rectifier assembly of FIGS. 2 and 3.
Figure 5:
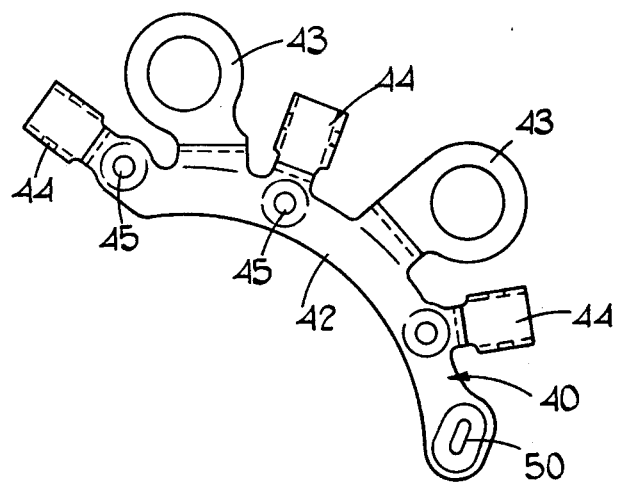
FIG. 5 is a plan view, on a larger scale, of another part of the electrical connector.
Figure 6:
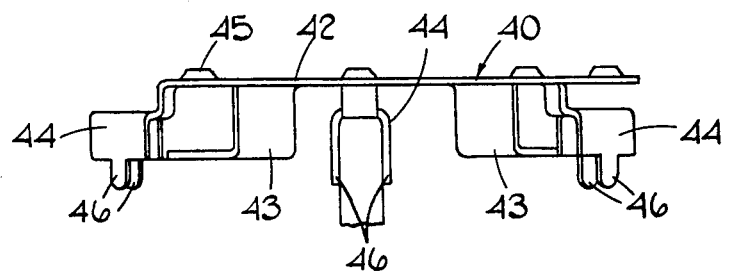
FIG. 6 is a side elevation of the part illustrated in FIG. 5.

The rectifier assembly 15 further includes a further set of three field diodes 36, and a common electrical connector 37. One of the terminals 38 of each diode 36 is soldered directly to the common electrical connector 37 whilst the other terminal 39 of each diode 36 is soldered directly to a respective one of the connectors 29. As can be seen best from FIGS. 2 and 3 each connector 29 includes integral fingers having plunged holes therein to receive the respective terminals 26, 28 and 39. The common electrical connector 37 is formed of first and second plates 40 and 41 (see especially FIGS. 4 to 6). The first plate 40 comprises an arcuate portion 22 having a pair of downwardly cranked, apertured legs 43 extending integrally therefrom. Also extending integrally therefrom are a set of three downwardly cranked, inverted U-shaped portions 44. The arcuate portion 42 has a series of three plunged holes 45 therethrough which are aligned with the U-shaped portions 44 and which receive the terminals 38 of the diodes 36. The U-shaped portions 44 are of a size to receive the bodies of the diodes 36 and are also provided with integral, deformable tags 46 extending downwardly from the arms thereof. The first plate is also provided with a plunged oval slot 50 therethrough.

The second plate 41 is generally planar except for the provision of a slotted cranked leg 47 which is integral with the remainder of the plate 41. The plate 41 is provided with a pair of apertures 48 therein which correspond to the apertures in the apertured legs 43 of the first plate 40. The second plate 41 is also provided with pairs of slots 49 therethrough. The spacing between the slots 49 of each pair is equal to that between the tags 46 of each U-shaped portion 44. During manufacture of the rectifier assembly 15, the terminals 38 of the diodes which have been previously cranked are inserted through the respective plunged holes 45 in the plate 40 and the bodies of the diodes 36 are inserted into the respective U-shaped portions 44. The first plate 40 and the two plates 40 and 41 are then brought together so that the apertured legs 43 abut against the plate 41 with the apertures in the legs 43 aligned with the apertures 48 and the tage 46 project through the respective slots 49. Then the tags 46 are bent over in order to retain the two plates 40 and 41 in mutual engagement. In this postion, the portions of the plate 41 lying between the slots 49 of each pair serve to retain the bodies of the diodes 36 within the U-shaped portion. The common electrical connector 37 consisting of the first and second plates 40, 41 is then mounted in position on the remainder of the rectifier assembly 15 by means of screws 32 which engage in screw-threaded holes in the plate 22 and which pass through the apertures in the legs 43 and the apertures 48. Electrically insulating bushes 33 are provided around the screws 32 to isolate the connector 37 from the plate 22. As mentioned hereinabove, the terminals 39 of the dioes 36 are connected with the respective connectors 29. The oval slot 50 in the first plate 40 has engaged therewith and soldered thereto an upper end of an upstanding terminal 51 mounted on an electrically insulated block 52. The block 52 is disposed between the plates 21 and 22 and with the afore-mentioned bushes 34 maintains the plates 21 and 22 in the desired spaced apart relationship. A rivet 63 passes through the block 52 and the plates 21 and 22 to secure these together. The terminals 51 form part of an electrically conducting plate 53 secured to the block 52 and having a further terminal 54 projecting integrally therefrom to provide a so-called "indicator" terminal of the alternator for connection with an ignition warning light of a motor vehicle to which the alternator is fitted. Battery terminals 55 are provided on a common plate 56 which also has integrally extending therefrom a terminal 57 for electrical connection with the voltage regulator 20. The plate 56 is trapped against the plate 22 so as to be in electrical contact therewith by means of the rivet 63 from which it is electrically insulated by means of an electrically insulating bush 67. The cranked leg 47 of the plate 41 is electrically connected with the rotor assembly 11 via the slip ring assembly 17 and one of the bushes (not shown). Contact between the other bush of the alternator and the rectifier assembly 15 is by way of the regulator 20. The leads 16 of the stator assembly 14 are snap-fitted into re-entrant recesses 68 in the connectors 29 and are subsequently soldered to ensure that there is a good electrical connection between the stator assembly 14 and the rectifier assembly 15. As will be apparent from FIG. 3, the soldered connections with all of the diode terminals are at the same level which enable a flow soldering operation to be performed to effect such soldered connections simultaneously.

In use, the alternator operates in a manner well known to those skilled in the art and its operation will therefore not be described in any detail.

A rectifier assembly incorporating the common electrical connector of the type described hereinabove for retaining the field diodes in position possesses the following advantages:

1. Soldering operations during manufacture of the assembly are simplified as compared with the case where the field diodes have to be supported by an assembler of the rectifier,
2. The field diodes are supported by their bodies and not by their terminals so that there is less chance of failure due to vibration in service,
3. Heat dissipation from the field diodes is maximised because of the heat sink effect of the common electrical connector with which the diodes are intimately in contact both by their terminals and by their bodies. This makes the assembly particularly suitable for use in large alternators when the heating effect in even the field diodes become appreciable.
4. The use of a separate electrically insulated moulding to hold the field diodes is avoided which not only allows relatively unrestricted access for air in the region of the power diodes but also makes the rectifier assembly suited to small volume production where it is particularly important to keep tooling costs to a minimum.
5. The overall design of the above-described rectifier assembly enables it to be readily changed from the European type configuration of the terminals 54 and 55 to other configurations where, for example, a screw-threaded terminal stud is provided on the brush housing 19 to replace the terminal 54 and a single screw-threaded terminal stud projects from the plate 56 in the place of the terminals 55.

We claim:

1. A multiphase full-wave rectifier assembly, comprising a first plate, a second plate substantially parallel to the first plate, first and second sets of diodes carried by the first and second plates respectively, terminals of the first set of diodes extending through holes in the second plate, a connector electrically connecting said terminal of each diode of the first set with a terminal of a respective diode of the second set, a further set of diodes, each said diode of said further set having a body and a pair of leads extending from opposite ends thereof, one of the leads of each diode of the further set being electrically connected with a respective one of the connectors, and a common electrical connector having recesses with electrically conducting walls engaging the bodies of said further set of diodes being electrically connected to the other leads of the diodes of the further set, and also being heat conducting.

2. An assembly as claimed in claim 1, wherein the receses are arranged to grip the bodies of the diodes.

3. An assembly as claimed in claim 1, wherein the common electrical connector comprises first and second plates which are secured together in electrical contact, and the recesses are defined between the plates.

4. An assembly as claimed in claim 3, wherein the first plate of the common electrical connector includes a series of substantially U-shaped portions which are closed by portions of the second plate of the common electrical connector whereby the recesses are in the form of open ended passages extending through the plate of the common electrical connector.

5. An assembly as claimed in claim 4, wherein the ends of the arm of the U-shaped portions are provided with deformable tags extending therefrom, said tags projecting through corresponding slots in the second plate of the common electrical connector and being turned over so as to hold the plates of the common electrical connector together.

6. An assembly as claimed in claim 4, wherein the U-shaped portions of the first plate of the common electrical connector are interconnected by a plate portion which is apertured to receive said other terminals of the diodes of the further set.

7. An assembly as claimed in claim 6, wherein the U-shaped portions are cranked so as to be displaced out of the plane of the interconnecting portion.

8. An assembly as claimed in claim 3, wherein the first plate of the common electrical connector is provided with apertured legs engaging against correspondingly apertured portions of the second plate of the common electrical connector, and fixing screws pass through said apertures to secure the common electrical connector to the remainder of the rectifier assembly.

9. An assembly as claimed in claim 1, wherein the common electrical connector comprises a plate having said recesses therein.

10. An assembly as claimed in claim 9, wherein the plate includes portions serving to retain the diodes in the recesses.

11. An alternator comprising a multiphase stator, a rotor, and a rectifier assembly as claimed in claim 1 each phase of said stator being electrically connected with a respective one of said connectors which electrically interconnect said terminal of each diode of the first set with the respective diode of the second set.

12. An alternator as claimed in claim 11, wherein each said electrical connector which interconnects the terminals of each diode of the first set with the respective diode of the second set has a re-entrant recess therein whereby an electrical lead of a respective phase can be snap-fitted into said recess.

* * * * *